United States Patent
Shao et al.

(10) Patent No.: US 9,478,311 B2
(45) Date of Patent: Oct. 25, 2016

(54) SHIFT REGISTER UNITS, GATE DRIVER CIRCUITS AND DISPLAY DEVICES

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xianjie Shao, Beijing (CN); Xiaohe Li, Beijing (CN); Honggang Gu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/500,635

(22) Filed: Sep. 29, 2014

(65) Prior Publication Data

US 2015/0371716 A1 Dec. 24, 2015

(30) Foreign Application Priority Data

Jun. 23, 2014 (CN) .......................... 2014 1 0284647

(51) Int. Cl.
*G09G 3/36* (2006.01)
*G11C 19/28* (2006.01)
*G09G 3/20* (2006.01)

(52) U.S. Cl.
CPC ............... *G11C 19/287* (2013.01); *G09G 3/20* (2013.01); *G09G 2310/0267* (2013.01); *G09G 2310/0286* (2013.01)

(58) Field of Classification Search
CPC ............................................ G09G 2310/0286
See application file for complete search history.

(56) References Cited

U.S. PATENT DOCUMENTS

| 2006/0291610 | A1* | 12/2006 | Lo | .......................... | G11C 19/28 377/64 |
|---|---|---|---|---|---|
| 2009/0086116 | A1 | 4/2009 | Pak | | |
| 2009/0201071 | A1 | 8/2009 | Jinta | | |
| 2010/0141642 | A1* | 6/2010 | Furuta | .................. | G11C 19/184 345/213 |

FOREIGN PATENT DOCUMENTS

| CN | 102621186 A | 8/2012 |
|---|---|---|
| CN | 102629444 A | 8/2012 |
| CN | 102651208 A | 8/2012 |

OTHER PUBLICATIONS

Chinese Office Action and its English translation dated Oct. 29, 2015, for corresponding Chinese Application No. 201410284647.1.

* cited by examiner

*Primary Examiner* — Carolyn R Edwards
(74) *Attorney, Agent, or Firm* — Kinney & Lange, P.A.

(57) ABSTRACT

The present disclosure provides a bi-directional scanning gate driver and its shift register unit. The shift register unit comprises a shift trigger signal/reset signal input terminal (1), a reset signal/shift trigger signal input terminal (2), the first clock terminal (6) and an output terminal (8). The shift trigger signal/reset signal input terminal (1) and the reset signal/shift trigger signal input terminal (2) are coupled to one of the shift trigger signal and the reset signal. When it is switched between the forward shift and the reverse shift, the signals coupled to the shift trigger signal/reset signal input terminal (1) and the reset signal/shift trigger signal input terminal (2) are exchanged. The first clock terminal (6) is coupled to a clock signal for providing a driving level to the output terminal (8). The circuit of such a shift register unit is constituted of at least four transistors and one capacitor. The structure of the circuit of the present disclosure is simple and may solve the technical problem of coupling noise voltage generated by the clock signal.

17 Claims, 8 Drawing Sheets

SHIFT REGISTER UNITS, GATE DRIVER CIRCUITS AND DISPLAY DEVICES

CROSS-REFERENCE TO RELATED APPLICATION(S)

This application claim priority to a Chinese Application No. 201410284647.1, filed on Jun. 17, 2014 and entitled "SHIFT REGISTERS, GATE DRIVER CIRCUITS AND DISPLAY DEVICES", which is incorporated herein by reference in their entirety.

TECHNICAL FIELD

The present disclosure relates to a driver circuit field, and particularly to a shift register unit, a gate driver circuit (gate driver IC) which employs the shift register unit and a display device.

BACKGROUND

The driver circuit of a display device mainly comprises a gate driver circuit (a scanning driver circuit) and a data driver circuit (or a source driver circuit). The gate driver circuit comprises cascaded shift register units in which the input clock signal CLK is converted by the shift register unit and then applied in turn to gate lines of each pixel lines of the display device to control the displaying of the display device in progressive scanning manner.

A circuit of a shift register unit of the prior art is shown in FIG. 1, which comprises four transistors and one capacitor, i.e. the first transistor M1, the second transistor M2, the third transistor M3, the fourth transistor M4 and a capacitor C.

The gate of the first transistor M1 is connected to its source and is further connected to a shift trigger signal input terminal 1 for receiving an input signal INPUT which is the output signal OUTPUT of the previous stage of shift register unit.

The gate of the second transistor M2 is connected to a reset signal input terminal 2 for receiving a reset signal RESET. The reset signal input terminal 2 is connected to an output terminal 8 of the subsequent stage of shift register unit. The drain of the second transistor M2 is connected to a constantly low level terminal 5 for receiving a low level signal VGL.

The source of the third transistor M3 is connected to a clock terminal 6 for receiving a clock signal CLK and its gate is connected to the output terminal 8 via the capacitor C.

The gate of the fourth transistor M4 is also connected to the reset signal input terminal 2, its drain is also connected to the constantly low level terminal VGL, and its source is connected to the output terminal 8.

The node between the drain of the first transistor M1 and the source of the second transistor M2 is a pull-up node PU. The output signal OUTPUT from the output terminal 8 is a gate scanning signal for the present stage of shift register unit.

When the previous shift register unit performs a gate scanning, the input signal INPUT for the present stage of shift register unit is at a high level, so that the first transistor M1 is turned on to pre-charge a pull-up node PU. In the next period, the clock signal CLK for the present stage of shift register unit is at a high level, so that the third transistor is turned on so as to make the output terminal 8 to be at a high level, that is to say, the output signal OUTPUT is at a high level. At the same time, the potential at the pull-up node PU is pulled-up again because of a Bootstrapping Effect. In the next period, the output signal of the subsequent stage of shift register unit is at a high level, i.e. the reset signal RESET at the reset signal input terminal 2 is at a high level, so that the second transistor M2 and the fourth transistor M4 are turned on to discharge a pull-up node PU and the output terminal 8 to reset.

The disadvantages of this type of shift register unit are as follows: the period during which a high level is applied to the fourth transistor M4 is short; a drift is generated at a DC bias; at most of time, the PU node and the OUTPUT terminal are suspended so that it is easy to be affected by the other parasitic capacitance, leading to faulty operation. Such faulty operation would lead to unevenness of the brightness of the display device and affect the quality of the product. Meanwhile, such a shift resister unit can't implement bi-directional scanning and the clock signal CLK may generate a coupling noise voltage.

SUMMARY

Technical Problem to be Solved

The technical problem to be solved by the present disclosure is to implement a bi-directional scanning of the gate driver circuit for a display device and to eliminate the effect of a coupling noise signal generated by the clock signal.

Technical Solution

According to one aspect of the present disclosure, there is provided a shift register unit, comprising: a pre-charging and scanning module configured to charge a pull-up node to pull up its potential or to maintain the pull-up level according to a shift trigger signal, a first clock signal and a second clock signal; a reset module configured to control the pull-up node and an output terminal to discharge to be reset to a low level according to a reset signal and the second clock signal; and a switching module configured to generate a shift direction control signal, and to exchange the input trigger signal and the reset signal and to exchange the first and second clock signals while a forward scanning and a reverse scanning are switched Preferably, the shift register unit may further comprise a shift trigger signal/reset signal input terminal (1), a reset signal/shift trigger signal input terminal (2), a positive/negative power supply voltage input terminal (3), a negative/positive power supply voltage input terminal (4) and an output terminal (8), first clock terminal (6) configured to couple a first clock signal, a second clock terminal (7) configured to couple a second clock signal, the time sequence of which is different from that of the first clock signal, wherein the pre-charging and scanning module comprising:
a first transistor (M1), the gate of which is connected to a shift trigger signal/reset signal input terminal (1), and the source of which is connected to a positive/negative power supply voltage input terminal (3);
a second transistor (M2), the gate of which is connected to a reset signal/shift trigger signal input terminal (2), the source of which is connected to the drain of the first transistor (M1), and the drain of which is connected to the negative/positive power supply voltage input terminal (4);
a third transistor (M3), the gate of which is connected to the drain of the first transistor (M1), the source of which is connected to the first clock signal (6), and the drain of which is connected to the output terminal (8);

a capacitor (C) connected between the drain of the first transistor (M1) and the output terminal (8);

the reset module comprising:

the second transistor (M2); and a fourth transistor (M4), the gate of which is connected to the second clock terminal (7), the source of which is connected to the output terminal (8), and the drain of which is connected to a constantly low level terminal (5);

wherein, under the control of the switching module, when the shift register unit shifts in a forward direction, the shift trigger signal/reset signal input terminal (1) is coupled to a shift trigger signal, the reset signal/shift trigger signal input terminal (2) is coupled to a reset signal, the positive/negative power supply voltage input terminal (3) is coupled to a high level signal (VDD), and the negative/positive power supply voltage input terminal (4) is coupled to a low level signal (VSS); and when the shift register unit shifts in a reverse direction, the shift trigger signal/reset signal input terminal (1) is coupled to the reset signal, the reset signal/shift trigger signal input terminal (2) is coupled to the shift trigger signal, the positive/negative power supply voltage input terminal (3) is coupled to a low level signal (VSS), and the negative/positive power supply voltage input terminal (4) is coupled to a high level signal (VDD).

According to another aspect of the present disclosure, there is further provided a gate driver circuit which is cascade connected by N shift register units as mentioned above, N being a natural number larger than 1, wherein except the first stage of shift register unit, the shift trigger signal/reset signal input terminal (1) of each of the shift register units is connected to an output terminal (8) of the previous stage of shift register unit, and the shift trigger signal/reset signal input terminal (1) of the first shift register unit is connected to a Start signal (STV);

except the last stage of shift register unit, the reset signal/shift trigger signal input terminal (2) of each of the shift register units is connected to an output terminal (8) of the subsequent stage of shift register unit, and the reset signal/shift trigger signal input terminal (2) of the last shift register unit is connected to the Start signal (STV).

According to another aspect of the present disclosure, there is further provided a display device comprising the gate driver circuit as mentioned above.

Technical Effects

The shift register unit of the present disclosure implements a bi-directional scanning by simply exchanging the shift trigger signal and the reset signal, so that the structure of the gate driver circuit is simplified and it is advantage to decrease cost.

The shift register unit of the present disclosure simultaneously couples a high level signal VDD and a low level signal VSS and exchanges the high level signal VDD and the low level signal VSS in the forward or reverse directional scanning, so as to increase the practicability.

One embodiment of the present disclosure not only implements a function of a bi-directional scanning for a gate driver, but also it considers the lifetime of the shift register unit and solves the problem of a coupling noise voltage generated by the clock signal.

One embodiment of the present disclosure further adds noise avoidance while the gate driver is suspended, which largely reduces the possibility of error outer of the gate driver and largely increase its reliability.

DETAILED DESCRIPTION

Figure 1:
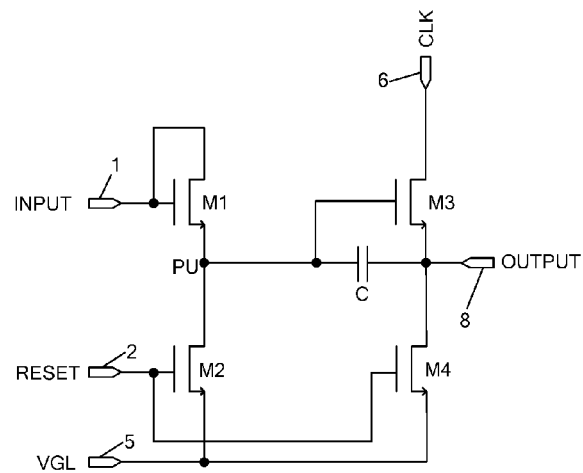
FIG. 1 is a circuit diagram of a shift register unit according to the prior art.

The shift register units connected in cascaded form may implement shift of a signal, which generally receives an output signal of the previous stage of a shift register unit as the shift trigger signal of the present stage of shift register unit, so as to output a high level signal at the next period (one period is a half of one clock cycle). Meanwhile, the shift register unit also receives an output signal of the subsequent stage of shift register unit as the reset signal for the present stage of shift register unit, so as to recover the output to be at a low level signal at the subsequent periods.

In the present disclosure, in order to implement a bi-directional scanning, a shift register unit is needs to be cascaded to shift in the forward and reverse directions. Thus, it is designed that the shift trigger signal/reset signal input terminal and the reset signal/shift trigger signal input terminal are coupled to one of the shift trigger signal and the reset signal, and the coupled shift trigger signal and the reset signal are exchanged when the forward shift and the reverse shift are switched.

The output of the shift register unit of the present disclosure is still provided with a driving level by a clock signal (the clock signal at the first clock terminal). That is to say, at the next period of the period in which the previous stage (in the forward direction) or the subsequent stage (in the negative direction) of shift register unit outputs a high level, the clock signal received at the first clock terminal is at a high level (the so called "previous stage" and "subsequent stage" refer to the "previous stage" and "subsequent stage" in a cascaded space order when a plurality of shift register units are cascaded). Since one cycle for the shift operation of the shift register unit (i.e. one time period) is a half of one clock cycle, the time sequence of the clock signal coupled at the first clock terminal of the shift register units for the adjacent stages of shift register unit should be opposite to each other. Thus, the present disclosure employs two clock signals with opposite time sequence. In this way, the two clock signals are alternatively coupled to drive stage by stage. Here, the term of "time sequence" refers to the distribution of a high level period and a low level period of the in time domain. The term of "opposite time sequence" refers to a situation in which when one signal is at a high level, the other signal is at a low level; and when one signal is at a low level, the other signal is at a high level. The term of "identical time sequence" refers to a situation in which when one signal is at a high level, the other signal is also at a high level; and when one signal is at a low level, the other signal is also at a low level.

The implementation of a shift register unit generally needs a high level signal or a low level signal. In order to meet the requirement of the bidirectional scanning proposed by the present disclosure, the present disclosure simultaneously provides a high level signal and a low level signal; and when it is switched between the forward shift and the reverse shift, the input terminals for the high level signal and the low level signal are also exchanged.

In order to make the object, technical solution and advantages of the present disclosure more apparent, the present disclosure would be further illustrated in detail by referring to the accompany figures in conjunction with the particular embodiments.

Figure 2:
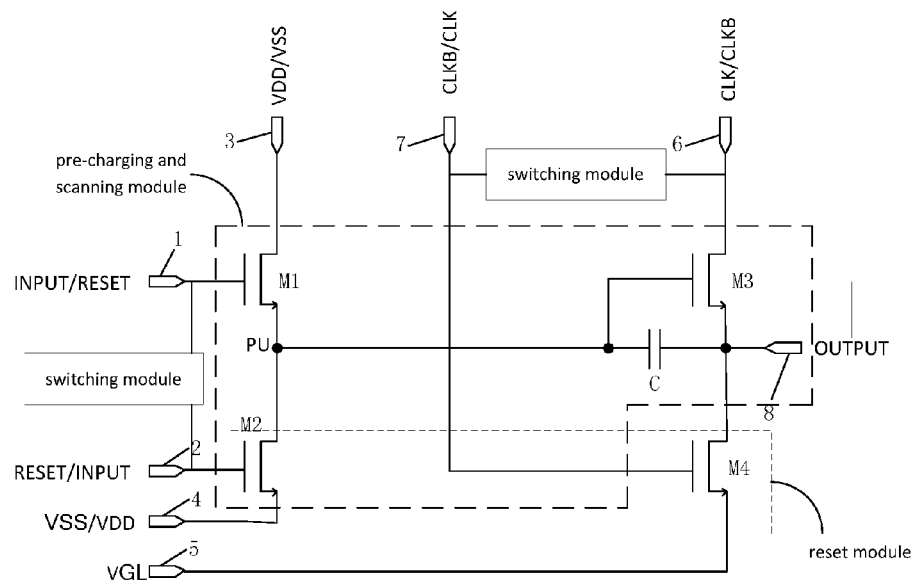
FIG. 2 is a circuit diagram of a shift register unit according to one embodiment of the present disclosure.

According to one aspect of the present disclosure, there is provided a shift register unit, comprising: a pre-charging and scanning module configured to charge a pull-up node to pull up its potential or to maintain the pull-up level according to a shift trigger signal, a first clock signal and a second clock signal; a reset module configured to control the pull-up node and an output terminal to discharge to be reset to a low level according to a reset signal and the second clock signal; and a switching module configured to generate a shift direction control signal, and to exchange the input trigger signal and the reset signal and to exchange the first and second clock signals while a positive directional scanning and a reverse scanning are switched Firstly, a basic circuit of the shift register unit according to the first embodiment of the present disclosure and a backs cascaded circuit of the gate driver circuit formed of the same are illustrated. FIG. 2 is a circuit diagram of the shift register unit of the embodiment. As shown in FIG. 2, the shift register unit of the present embodiment comprises at least seven input terminals and one output terminal, as well as at least four transistors and one capacitor.

In particular, the shift register unit may further comprise a shift trigger signal/reset signal input terminal (1), a reset signal/shift trigger signal input terminal (2), a positive/negative power supply voltage input terminal (3), a negative/positive power supply voltage input terminal (4) and an output terminal (8), a first clock terminal (6) configured to couple a first clock signal, and a second clock terminal (7) configured to couple a second clock signal, the time sequence of which is different from that of the first clock signal, wherein the pre-charging and scanning module comprising: a first transistor (M1), the gate of which is connected to a shift trigger signal/reset signal input terminal (1), and the source of which is connected to a positive/negative power supply voltage input terminal (3); a second transistor (M2), the gate of which is connected to a reset signal/shift trigger signal input terminal (2), the source of which is connected to the drain of the first transistor (M1), and the drain of which is connected to the negative/positive power supply voltage input terminal (4); a third transistor (M3), the gate of which is connected to the drain of the first transistor (M1), the source of which is connected to the first clock signal (6), and the drain of which is connected to the output terminal (8); a capacitor (C) connected between the drain of the first transistor (M1) and the output terminal (8); the reset module comprising: the second transistor (M2); and a fourth transistor (M4), the gate of which is connected to the second clock terminal (7), the source of which is connected to the output terminal (8), and the drain of which is connected to a constantly low level terminal (5); wherein, under the control of the switching module, when the shift register unit shifts in a forward direction, the shift trigger signal/reset signal input terminal (1) is coupled to a shift trigger signal, the reset signal/shift trigger signal input terminal (2) is coupled to a reset signal, the positive/negative power supply voltage input terminal (3) is coupled to a high level signal (VDD), and the negative/positive power supply voltage input terminal (4) is coupled to a low level signal (VSS); and when the shift register unit shifts in a reverse direction, the shift trigger signal/reset signal input terminal (1) is coupled to a reset signal, the reset signal/shift trigger signal input terminal (2) is coupled to a shift trigger signal, the positive/negative power supply voltage input terminal (3) is coupled to a low level signal (VSS), and the negative/positive power supply voltage input terminal (4) is coupled to a high level signal (VDD).

The node between the drain of the first transistor M1 and the source of the second transistor M2 is referred to as the pull-up node PU. The output terminal 8 is configured to output an output signal OUTPUT. The constantly low level terminal 5 is configured to couple to a constantly low level signal VGL.

The first clock terminal 6 is coupled to a clock signal which is configured to provide a driving level to the output terminal 8. The second clock terminal 7 is coupled to another clock signal the time sequence of which is different from that of the clock signal coupled to the first clock terminal 6.

When the shift register unit shifts in a forward direction, the shift trigger signal/reset signal input terminal 1 is coupled to a shift trigger signal, the reset signal/shift trigger signal input terminal 2 is coupled to a reset signal RESET, the positive/negative power supply voltage input terminal 3 is coupled to a high level signal VDD, and the negative/positive power supply voltage input terminal 4 is coupled to a low level signal (VSS).

When the shift register unit shifts in a reverse direction, the shift trigger signal/reset signal input terminal 1 is coupled to a reset signal RESET, the reset signal/shift trigger signal input terminal 2 is coupled to a shift trigger signal, the positive/negative power supply voltage input terminal 3 is coupled to a low level signal VSS, and the negative/positive power supply voltage input terminal 4 is coupled to a high level signal VDD. As shown in FIG. 2, the shift trigger signal is also denoted as the input signal INPUT in the present disclosure.

Figure 3:
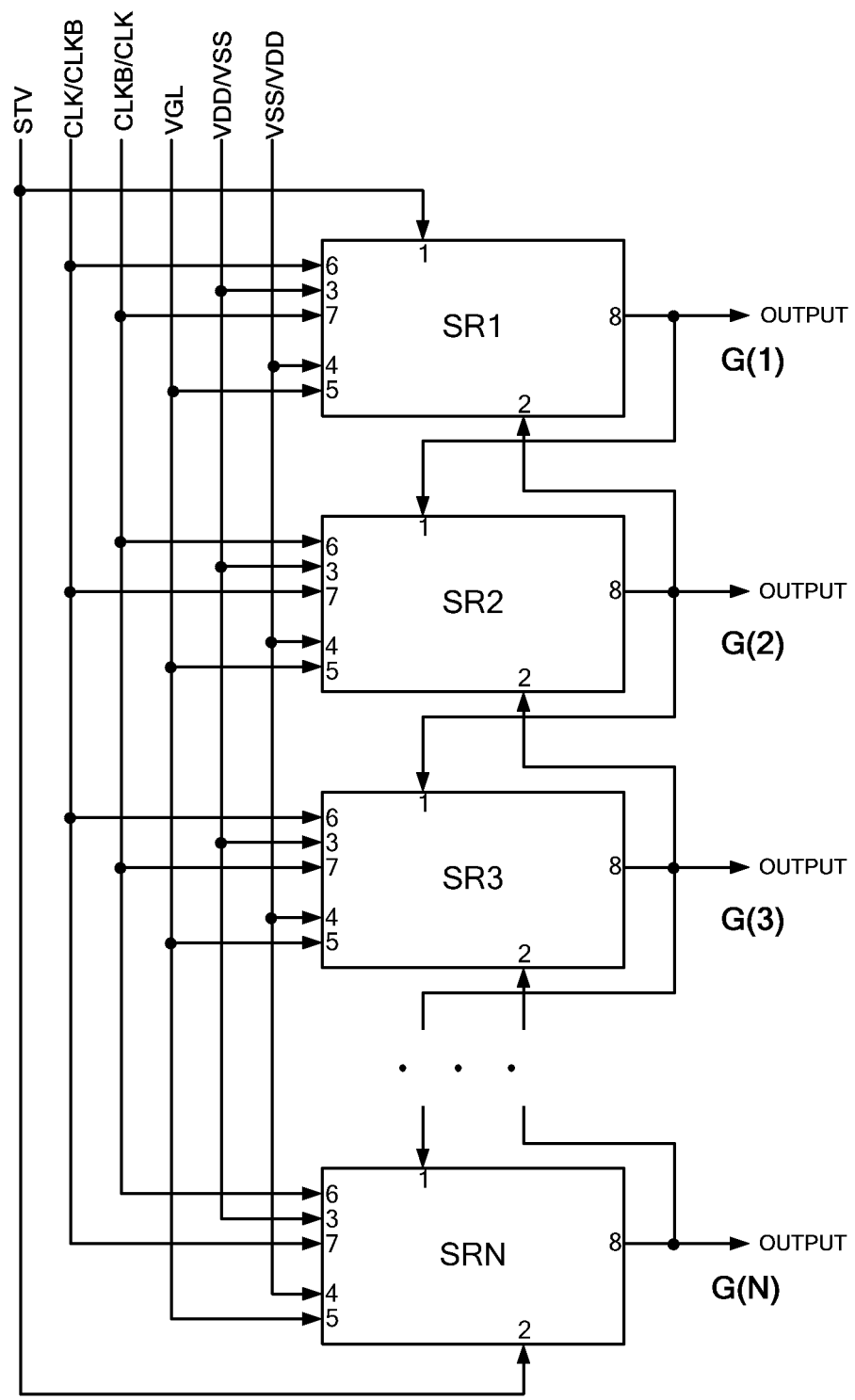
FIG. 3 is a cascade circuit diagram of a gate driver circuit according to one embodiment of the present disclosure.

FIG. 3 is a schematic view of the cascade circuit of a gate driver circuit according to the first embodiment of the present disclosure. In the figures, reference signs of $SR_1$-$SR_N$ are used to represent the cascaded shift register units. $SR_n$ represents the $n^{th}$ stage of shift register unit, n being a natural number between 1 and N, N being a natural number larger than 1. The shift register units according to the above mentioned embodiments forms a gate driver circuit in cascade connection. Thus, the non-interlaced scanning of the respective pixels lines may be implemented by the shift of the shift register units.

As shown in FIG. 3, in this embodiment, except the first stage of shift register unit $SR_1$, the shift trigger signal/reset signal input terminal 1 of each of the shift register units is connected to an output terminal 8 of the previous stage of shift register unit $SR_{n-1}$, and the shift trigger signal/reset signal input terminal 1 of the first stage of shift register unit is connected to a Start signal STV; and except the last stage of shift register unit $SR_N$, the reset signal/shift trigger signal input terminal 2 of each of the shift register units is connected to an output terminal 8 of the subsequent stage of shift register unit $SR_{n+1}$, and the reset signal/shift trigger signal input terminal 2 of the last stage of shift register unit $SR_N$ is connected to the Start signal STV.

For one of the shift register units, $SR_n$, during a shift, the shift trigger signal/reset signal input terminal 1 is coupled to an output signal of the previous stage of shift register unit $SR_{n-1}$ or the Start signal STV as the input signal INPUT, and the reset signal/shift trigger signal input terminal 2 is coupled to an output signal OUTPUT of the subsequent stage of shift register unit $SR_{n+1}$ as the reset signal RESET; and during a reverse shift, the reset signal/shift trigger signal input terminal 2 is coupled to an output signal of the subsequent stage of shift register unit $SR_{n+1}$ or the Start signal STV as the input signal INPUT, and the shift trigger signal/reset signal input terminal 1 is coupled to an output signal OUTPUT of the previous stage of shift register unit $SR_{n-1}$ as the reset signal RESET.

The first clock terminal 6 and the second clock terminal 7 of the respective stages of the shift register units is coupled to the first clock signal CLK or the second clock signal CLKB, and the time sequences of the first clock signal CLK and the second clock signal CLKB are opposite to each other. In addition, for each of the shift register units, the clock signals coupled to the first clock terminal 6 and the second clock terminal 7 are different; the clock signals coupled to the first clock terminal 6 and coupled to the first clock terminal 6 of the adjacent stage of shift register units are different; and the clock signals coupled to the second clock terminal 7 and coupled to the second clock terminal 7 of the adjacent stage of shift register units are different. When the shift register unit is switched between the forward shift and the reverse shift, the clock signals coupled to the first clock terminal 6 and to the second clock terminal 7 of the shift register unit are exchanged with each other.

That is to say, the phase of the first clock signal CLK and that of the second clock signal CLKB are opposite to each other. When the first clock terminal 6 of the present stage of shift register unit is coupled to the first clock signal CLK, the first clock terminals 6 of the previous and the subsequent stages of shift register units are coupled to the second clock signal CLKB; and when the first clock terminal 6 of the present stage of shift register unit is coupled to the second clock signal CLKB, the first clock terminals 6 of the previous and the subsequent stages of shift register units are coupled to the first clock signal CLK.

Furthermore, when the first clock terminal 6 of the $n^{th}$ stage of shift register unit $SR_n$ is coupled to the first clock signal CLK, its second clock terminal 7 is coupled to the second clock signal CLKB. As well, the first clock terminals 6 of the (n+1)th and the (n−1)th stages of the shift register units $SR_{n-1}$ and $SR_{n+1}$ are coupled to the second clock signal CLKB, and their second clock terminals 7 are coupled to the first clock signal CLK.

In addition, in the gate driver circuit of the present embodiment, when the shift register unit shifts in a forward direction, the positive/negative power supply voltage input terminal 3 is coupled to a high level signal VDD and the negative/positive power supply voltage input terminal 4 is coupled to a low level signal VSS; and when the shift register unit shifts in a reverse direction, the positive/negative power supply voltage input terminal 3 is coupled to a low level signal VSS and the negative/positive power supply voltage input terminal 4 is coupled to a high level signal VDD.

Figure 4A:
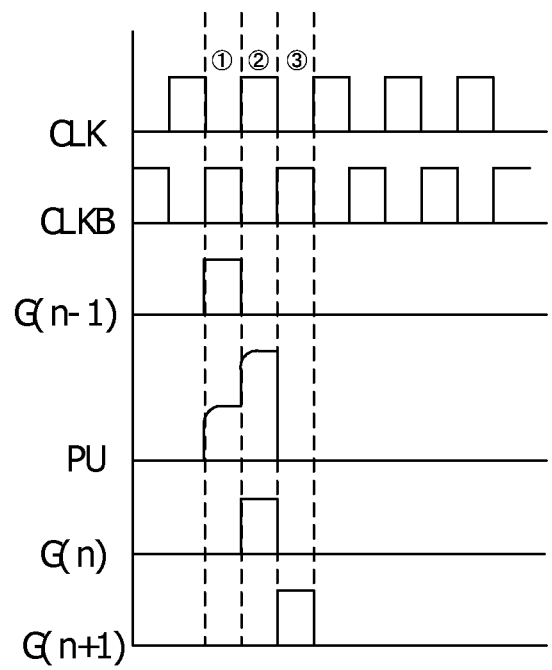
FIGS. 4A and 4B show a signal sequence chart in a forward scanning and a reverse scanning according to one embodiment of the present disclosure, respectively.
Figure 4B:
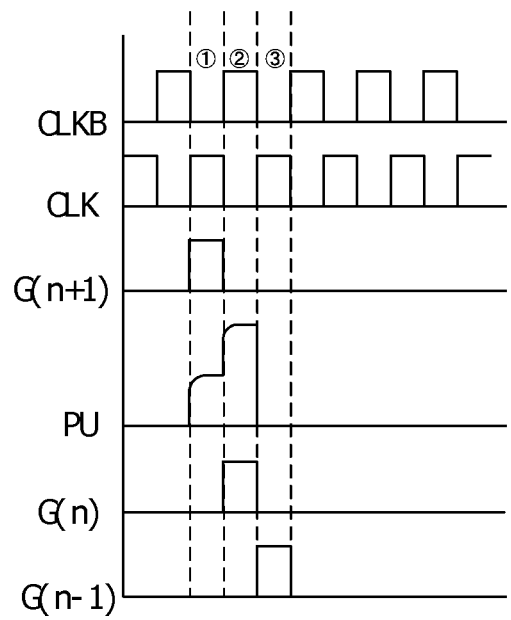

FIGS. 4A and 4B show a signal sequence chart in a forward shifting and a reverse shifting according to the first embodiment of the present disclosure, respectively. In FIGS. 4A and 4B, the signal G(n) represents the output signal OUTPUT of the $n^{th}$ stage of shift register unit, and the signals G(n−1) and G(n+1) represent the output signals OUTPUT of the $(n-1)^{th}$ and the $(n+1)_{th}$ stages of shift register units.

When the output signals G(n) of the previous stage and the subsequent stages of shift register units $SR_{n-1}$ and $SR_{n+1}$ for the $n^{th}$ stage of shift register unit $SR_n$ both are at a low level, i.e. the input signal INPUT coupled to the shift trigger signal/reset signal input terminal 1 and the reset signal/shift trigger signal input terminal 2 for the $n^{th}$ shift register unit are both at a low level, the first transistor M1 and the second transistor M2 are both turned off, so that the second clock signal CLKB controls the on/off state of the fourth transistor M4. The output terminal 8 of the $n^{th}$ stage of shift register unit SRn are continuously discharged through the fourth transistor M4 so as to be stably kept at a low level. In these periods, the $n^{th}$ stage of shift register unit $SR_n$ does not scan, so it is referred to as non-scanning period.

When the gate driver shifts in a forward direction to scan the pixel line in a forward direction, the $(n-1)^{th}$ stage (i.e. the previous stage) of shift register unit $SR_{n-1}$ or the Start signal STV outputs a high level at a certain moment, so such a period is referred to as the first period (labeled as ① in the figure). At this moment, the input signal INPUT of the shift trigger signal/reset signal input terminal 1 of the $n^{th}$ stage of shift register unit $SR_n$ is at a high level, the reset signal/shift trigger signal input terminal 2 is kept to be as a low level, and the first clock signal CLK coupled to the first clock terminal 6 and the second clock signal CLKB coupled to the second clock terminal 7 are at a low level and a high level, respectively. At this moment, the first transistor M1 is turned on and the second transistor M2 is turned off, which leads to that the pull-up node PU receives a high level signal VDD and changes to be a high level so as to charge the capacitor C. The high level of the pull-up node controls the third transistor M3 to be turned on. However, since the first clock signal CLK is at a low level this moment, the output terminal 8 of the $n^{th}$ stage of shift register unit $SR_n$ is still at a low level. Thus, such a period is a period in which the $(n-1)^{th}$ stage of shift register unit $SR_{n-1}$ to scan, that is to say, a period in which the $n^{th}$ stage of shift register unit SRn is pre-charged, so it is referred to as a pre-charging period.

During the second period (labeled as ② in the figure), the output terminal of the $(n-1)^{th}$ stage of shift register unit $SR_{n-1}$ outputs a low level. At this moment, the first transistor M1 is turned off and the pull-up node continues to be kept at a high level. The first clock signal CLK coupled to the first clock terminal 6 changes to be at a high level. Due to the presence of the capacitor C, the third transistor M3 is kept to be at a turned-on state, and the fourth transistor M4 is turned off since the second clock signal CLKB become a low level. At this moment, since the first clock signal CLK coupled to the first clock terminal 6 is at a high level, the pull-up node PU amplifies the voltage at the pull-up node PU due to the bootstrapping effect. The output terminal 8 is charged to be a high level by the first clock signal CLK. Such a period is a period in which the present stage of shift register unit $SR_n$ to scan, so it is referred to as a present stage scanning period.

During the third period (labeled as ③ in the figure), the output terminal of the $(n+1)^{th}$ stage of shift register unit $SR_{n+1}$ outputs a high level, i.e. the reset signal RESET coupled to the reset signal/shift trigger signal input terminal 2 is at a high level. At this moment, the high level at the reset signal/shift trigger signal input terminal 2 enables the second transistor M2 to be turned on, and the pull-up node PU is connected to the low level signal VSS at the negative/positive power supply voltage input terminal so as to be discharged to be a low level. At this moment, the second clock signal CLKB coupled to the second clock terminal 7 is at a high level to turn on the fourth transistor M4, so that the output terminal 8 is connected to the constantly low level signal VGL to be discharged to be a low level. Such a period is a period in which the pull-up node and the output terminal of the $n^{th}$ stage of shift register unit $SR_n$ are discharged to be reset, so it is referred to as a reset period.

In the next period, the output signals G(n−1) and G(n+1) of the $(n−1)^{th}$ stage and the $(n+1)^{th}$ stages of shift register units both are at a low level. The pull-up node and the output terminal of the $n^{th}$ stage of shift register unit are kept to be at a low level, i.e. in the non-scanning period, until the next non-interlaced scanning repeats these three periods of the pre-charging period, the present stage scanning period, and the reset periods as mentioned above.

Since the clock signals CLK and CLKB switches between the high level and the low level every half of one clock cycle, the length of the respective period as mentioned above is half of the cycle of the clock signal. Thus, the time span during which the output terminal 8 of each of the shift register unit $SR_n$ outputs a high level, i.e. the time span for scanning, is half of one cycle of the clock signal. For the cascaded shift register units, in order to ensure that the time sequence of the coupled clock signals proceeds stage by stage at the respective periods, it needs to alternatively couple the first clock signal CLK and the second clock signal CLKB.

In order to shift in a reverse direction to implement a negative scanning, in the present embodiment, it only needs to exchange the signals coupled to the positive/negative power supply voltage input terminal 3 and negative/positive power supply voltage input terminal 4, and the clock signals coupled to the first clock terminal 6 and the second clock terminal 7 of the respective stages of shift register units are also exchanged. That is to say, it only needs to exchange the positions for coupling to the first clock signal CLK and the second clock signal CLKB, without changing the connection of the shift trigger signal/reset signal input terminal 1 and the reset signal/shift trigger signal input terminal 2. In this way, whether it implements a forward scanning or a reverse scanning, the first transistor M1 and the second transistor M2 are capable of pre-charging the pull-up node PU during a period before the shift register unit performs the scanning of the present line and are capable of staring discharging the pull-up node PU during a period after the shift register unit performs the scanning of present line. Furthermore, whether it implements a forward scanning or a reverse scanning, the input signal INPUT is received at a period before the present stage of shift register unit performs the scanning of the present line, so as to control the present stage of shift register unit to output a high level signal at the current period, and the reset signal RESET is received at a period after the present stage of shift register unit performs the scanning of the present line, so as to control the present stage of shift register unit to output a low level signal after the scanning of the present line. The time sequence of the reverse scanning is shown in FIG. 4B and is omitted for brevity.

As mentioned above, except the shift register units in the two ends, the shift trigger signal/reset signal input terminal 1 and the reset signal/shift trigger signal input terminal 2 in a cascaded connection are connected to the output terminals of the previous stage of shift register unit and the subsequent stage of shift register unit, respectively. When the forward shift and the reverse shift are switched, their connection does not change and the functions of the signals coupled to them change. During a forward shift, the shift trigger signal/reset signal input terminal 1 couples the output signal OUTPUT of the previous stage of shift register unit or a Start signal STV as its input signal INPUT; and during a reverse shift, the reset signal/shift trigger signal input terminal 2 couples the output signal OUTPUT of the subsequent stage of shift register unit or a Start signal STV as its input signal INPUT. In a similar way, during a forward shift, the shift trigger signal/reset signal input terminal 1 couples the output signal OUTPUT of the subsequent stage of shift register unit or a Start signal STV as its reset signal RESET; and during a reverse shift, the reset signal/shift trigger signal input terminal 2 couples the output signal OUTPUT of the previous stage of shift register unit as its reset signal RESET.

The first embodiment employs a simple circuit which only uses fourth transistors and one capacitor to get a function of bi-directional shift. Meanwhile, when the present stage of shift register scans, the pull-up node PU is kept at a high level voltage due to the bootstrapping effect, which ensures the stability of the output.

Figure 5:
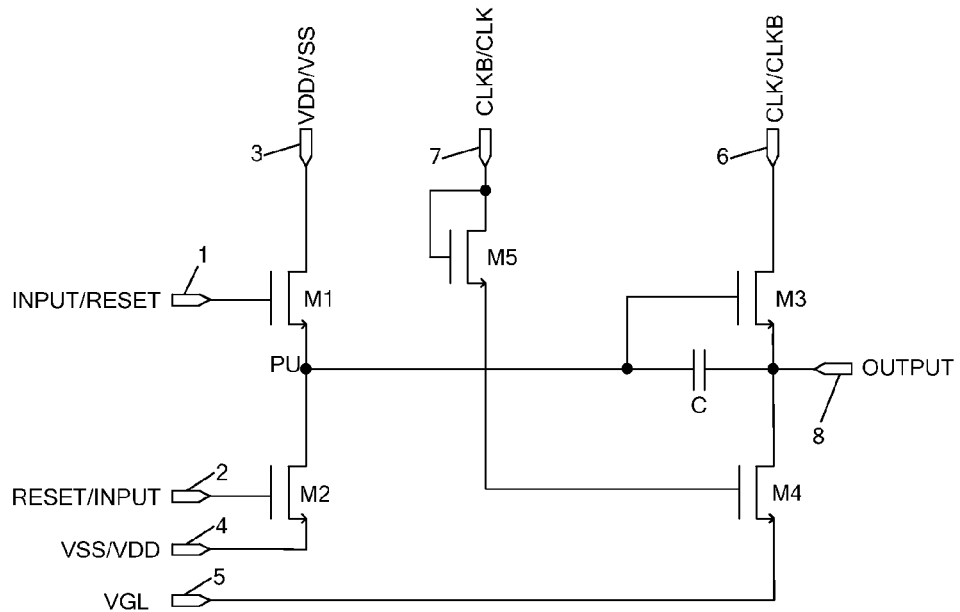
FIG. 5 is a circuit diagram of a shift register unit according to another embodiment of the present disclosure.

FIG. 5 shows a circuit diagram of a shift register unit according to the second embodiment of the present disclosure. The cascaded connection of the gate driver circuit of such an embodiment is identical to that of the first embodiment, except for the arrangement of each of the shift register unit. As shown in FIG. 5, the shift register unit of such an embodiment may further comprise the fifth transistor M5, as compared with the first embodiment. The source and gate of the fifth transistor M5 are connected to each other, its source is coupled to the second clock terminal 7, and its drain is coupled to the gate of the fourth transistor M4.

The function of the fifth transistor M5 is as follows: after the reset period, when the clock signal coupled to the second clock terminal 7 is at a low level, the path between the gate of the fourth transistor M4 and the second clock terminal 7 is not on, so that the gate is kept at a high level to enable the fourth transistor M4 continuously to be turned on to continuously discharge the output terminal 8, which increases the output stability of the output terminal during the non-scanning period. Meanwhile, the present of the fifth transistor M5 can also avoid coupling noise generated by the second clock terminal 7.

Figure 6:
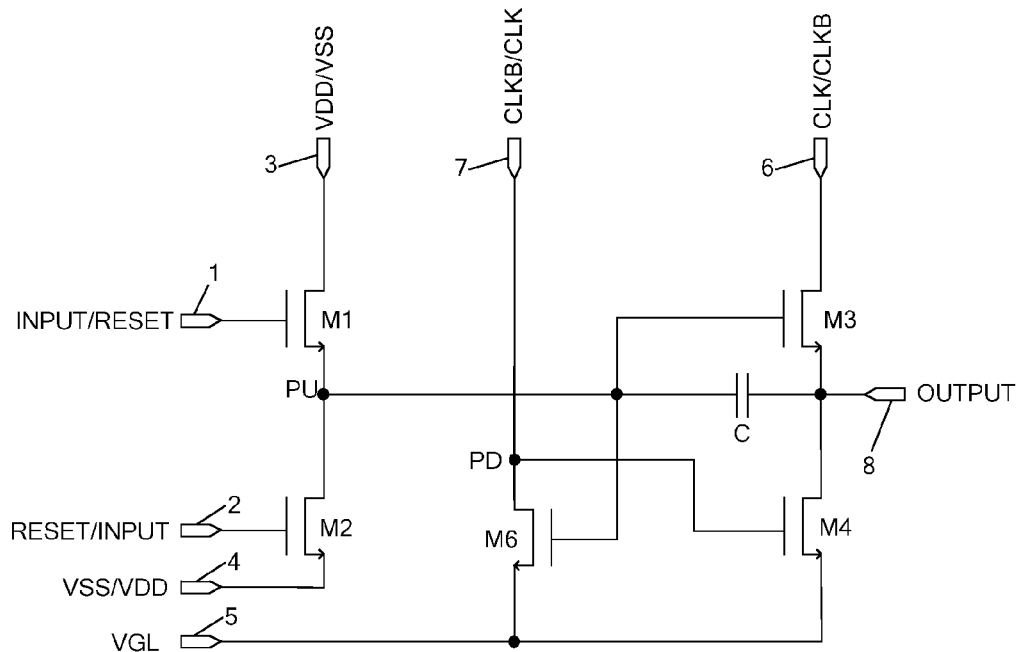
FIG. 6 is a circuit diagram of a shift register unit according to another embodiment of the present disclosure.

FIG. 6 shows a circuit diagram of a shift register unit according to the third embodiment of the present disclosure. The cascaded connection of the gate driver circuit of such an embodiment is identical to that of the first embodiment, except for the arrangement of each of the shift register unit. As shown in FIG. 6, the shift register unit of the third embodiment may further comprise the sixth transistor M6, as compared with the first embodiment. The source of the fifth transistor M5 is connected to the gate of the fourth transistor M4, the drain of the sixth transistor is connected to the constantly low level terminal 5, and the gate of the sixth transistor is connected to the gate of the third transistor, i.e. the PU node. Here, the node for connecting to the gate of the fourth transistor M4 is referred to as a pull-down node PD.

In this way, during the pre-charging period and the present stage scanning period, when the pull-up node PU is at a high level voltage, the sixth transistor M6 is turned on so that the pull-down node PD is kept at a low level and the fourth transistor M4 is turned off. Thus, the output terminal 8 would not be discharged and the output stability is maintained. During the reset period and the subsequent periods, the pull-up node PU is discharged by the second transistor M2 so that the sixth transistor M6 is turned off and it does not affect the subsequent operations of the circuit.

Figure 7:
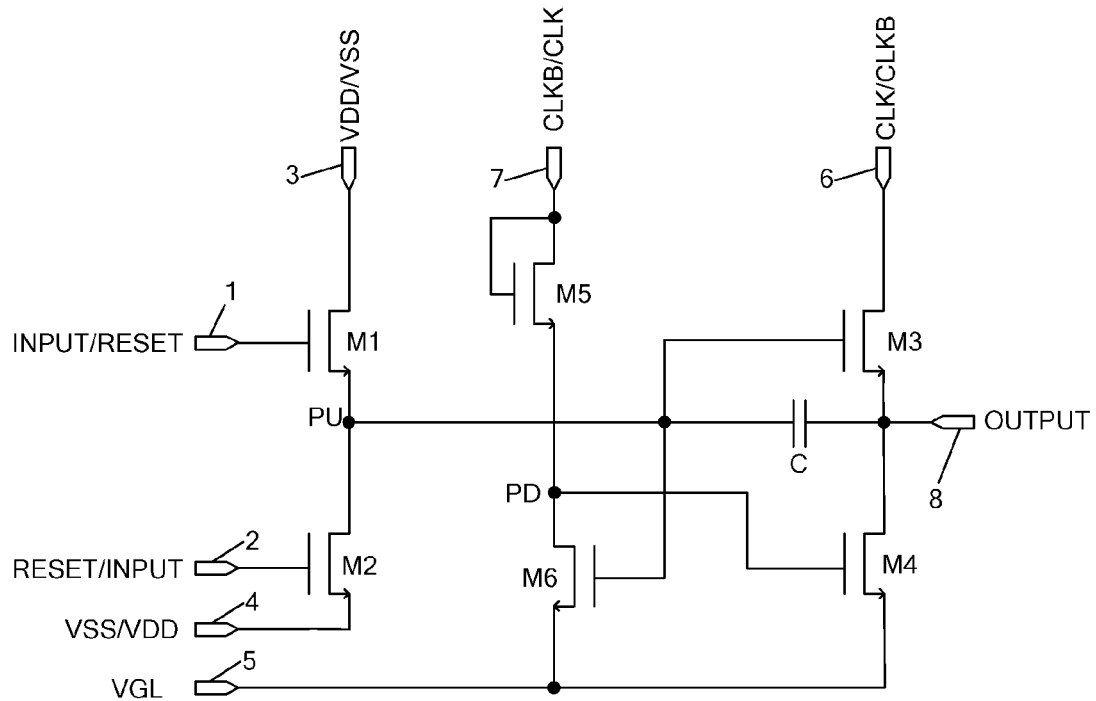
FIG. 7 is a circuit diagram of a shift register unit according to another embodiment of the present disclosure.

FIG. 7 shows a circuit diagram of a shift register unit according to the fourth embodiment of the present disclosure in which it incorporates the shift register units of the second and third embodiments. The cascaded connection of the gate driver circuit of such an embodiment is identical to those of the previous embodiments and is omitted for brevity. As shown in FIG. 7, the shift register unit of the third embodiment may further comprise the fifth transistor M5 and the sixth transistor M6. The connection of the fifth transistor M5 and that of the sixth transistor M6 are identical to those of the second and third embodiments respectively.

The fourth embodiment may improve the output stability of the shift register units during the respective periods.

Figure 8:
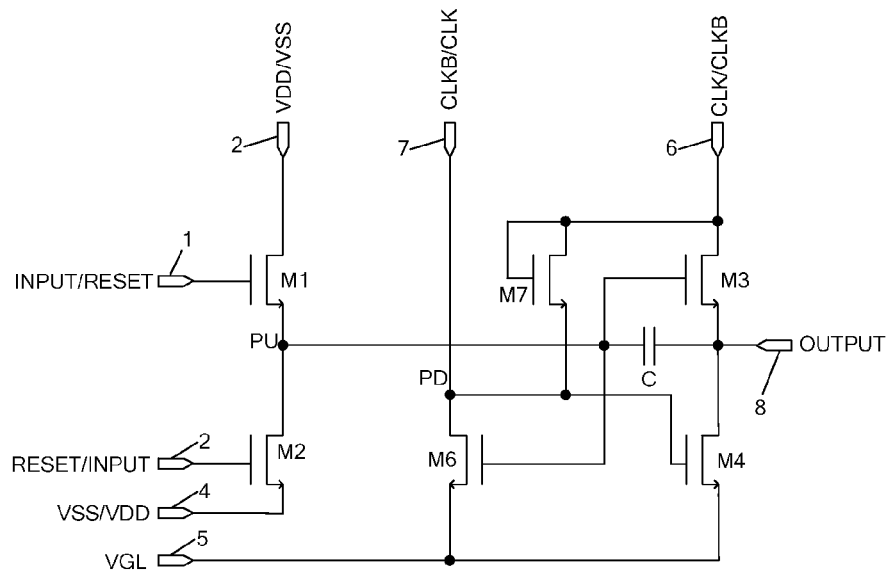
FIG. 8 is a circuit diagram of a shift register unit according to another embodiment of the present disclosure.

FIG. 8 shows a structure of a shift register unit according to the fifth embodiment of the present disclosure. The cascaded connection of the gate driver circuit of such an embodiment is identical to that of the first embodiment and is omitted for brevity. The shift register unit of such an embodiment may further comprise the seventh transistor M7, as compared with the first embodiment. As shown in FIG. 8, the gate and source of the seventh transistor are coupled to each other, and its source and drain are coupled to the first clock terminal 1 and the gate of the fourth transistor M4, respectively.

During the scanning period, since the pull-up node PU is at a high level, the sixth transistor M6 is turned on and the seventh transistor M7 is simultaneously turned on. The gate of the fourth transistor M4 corresponds to be short-circuited, which leads to that the fourth transistor M4 is turned off so that it does not affect the output of the output terminal 8.

During the non-scanning period, since the time sequences for the clock signals coupled to the first clock terminal 6 and the second clock terminal 7 are opposite to each other, the seventh transistor M7 is turned on when the clock signal coupled to the second clock terminal 7 is at a low level. The gate of the fourth transistor M4 is always at a high level, i.e. the fourth transistor M4 is always turned on to continuously avoid the noise of the output terminal 8 to improve the stability of the circuit.

Figure 9:
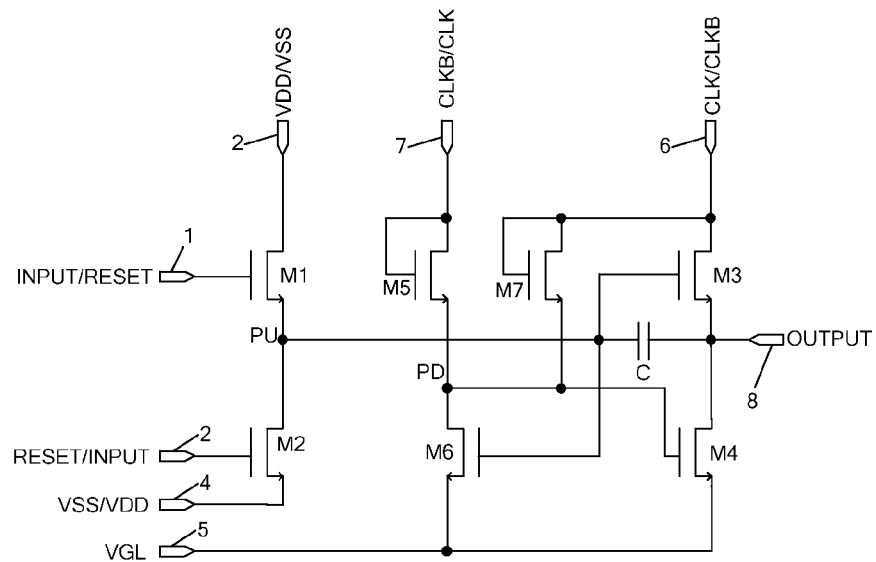
FIG. 9 is a circuit diagram of a shift register unit according to another embodiment of the present disclosure.

FIG. 9 shows a circuit diagram of a shift register unit according to the sixth embodiment of the present disclosure in which it incorporates the shift register units of the second and fifth embodiments. The cascaded connection of the gate driver circuit of such an embodiment is identical to those of the previous embodiments and is omitted for brevity. As shown in FIG. 9, the shift register unit of the third embodiment may further comprise the fifth transistor M5. The source and gates of the fifth transistor M5 are connected to each other and the drain of the fifth transistor is connected to the pull-down node PD.

Since the time sequences for the clock signals coupled to the first clock terminal 6 and the second clock terminal 7 are opposite to each other, the fifth transistor M5 and the seventh transistor M7 are alternative turned on. The gate of the fourth transistor M4 is always at a high level, i.e. the fourth transistor M4 is always turned on to continuously avoid the noise of the output terminal 8 to improve the stability of the circuit.

Figure 10:
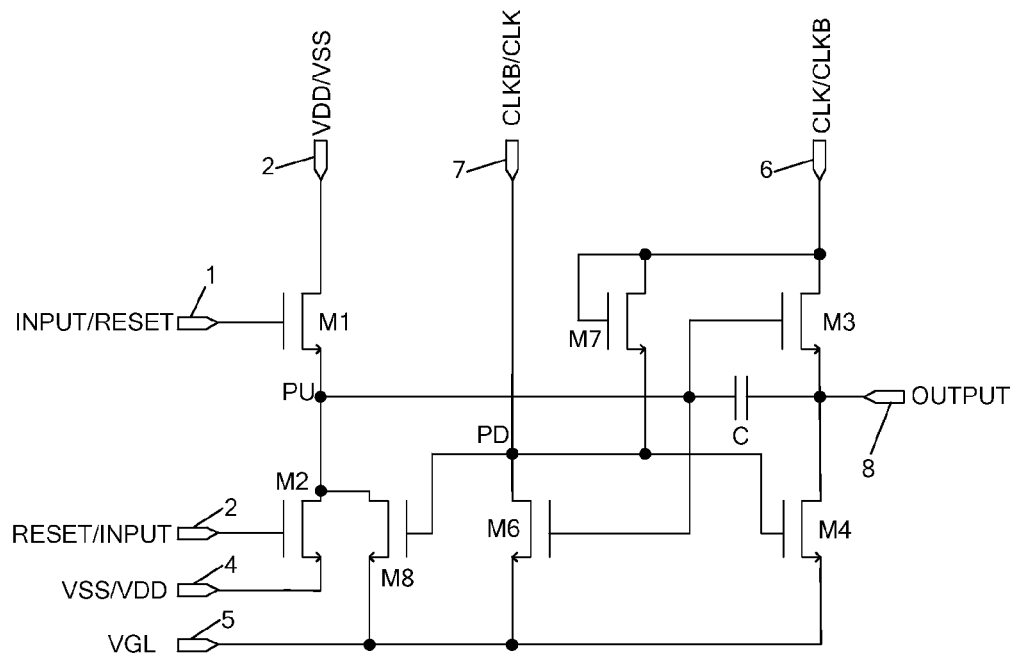
FIG. 10 is a circuit diagram of a shift register unit according to another embodiment of the present disclosure.
Figure 11:
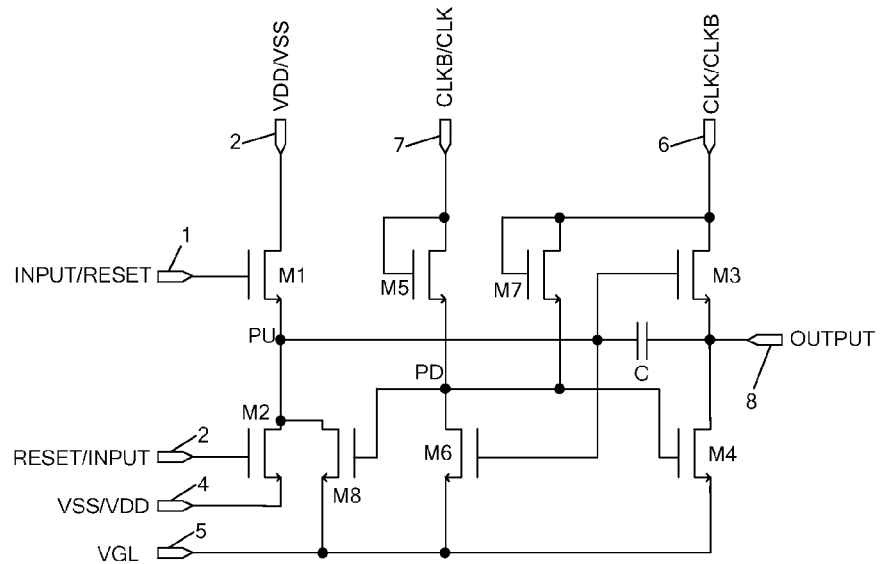
FIG. 11 is a circuit diagram of a shift register unit according to another embodiment of the present disclosure.

FIG. 10 and FIG. 11 show structures of the shift register unit according to the seventh and eight embodiments of the present disclosure, which may further improvement on the fifth and sixth embodiments, respectively. The cascaded connection of the gate driver circuit of these two embodiments is identical to those of the previous embodiments and is omitted for brevity. As shown in FIG. 10 and FIG. 11, the shift register unit of the seventh and eighth embodiments may further comprise the eighth transistor M8, as compared with the fifth and sixth embodiments. The gate of the eighth transistor M8 is coupled to the gate of the fourth transistor M4, i.e. the pull-down node PD, the source of the eighth transistor M8 is coupled to the source of the second transistor M2, and the drain of the eight transistor M8 is coupled to the constantly low level terminal 5.

Similar to the fourth transistor M4, during the non-scanning period, the eighth transistor M8 is always turned on. Thus, during the non-scanning period, it continuously avoids the noise of the pull-up node PU to improve the stability of the circuit.

Figure 12A:
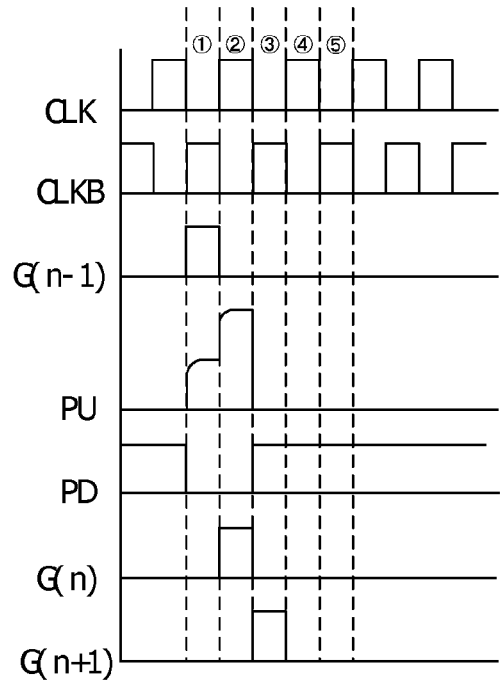
FIGS. 12A and 12B show a signal sequence chart in a forward scanning and a reverse scanning according to embodiments as shown in FIGS. 9, 10 and 11, respectively.
Figure 12B:
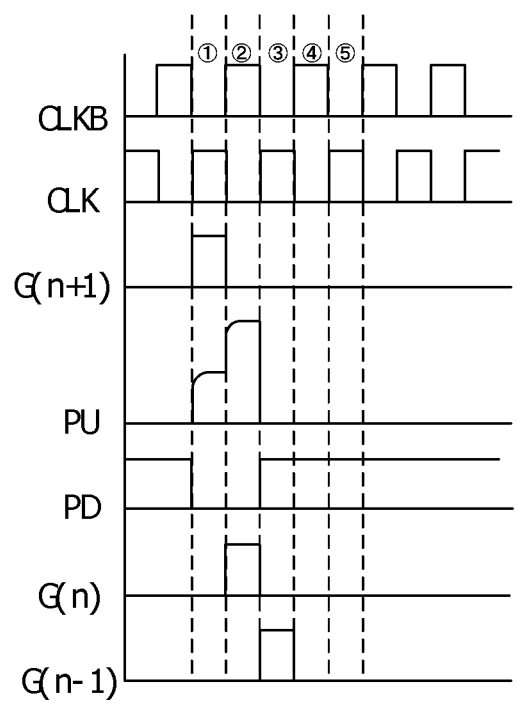

FIGS. 12A and 12B show signal sequence charts in a positive scanning and a negative scanning of the shift register units according to the sixth to eighth embodiments, respectively. The time sequence of the present embodiment is similar to that of the first embodiment except the time sequence of the signal at the pull-down node PD are added in the time sequence chart.

For the pre-charging period (the first period), the scanning period (the second period) and the reset period (the third period), the time sequences are identical to that of the shift register unit according to the first embodiment of the present disclosure, so it is omitted for brevity.

During the fourth period (labeled as ④ in FIGS. 12A and 12B) after the reset period (the third period), for the $n^{th}$ stage of shift register unit $SR_n$, the first clock signal CLK is at a high level, and the second clock signal CLKB is at a low level. At this moment, the seventh transistor M7 is turned on. Since the pull-up node PU is discharged by the second transistor M2 in the previous period, the sixth transistor M6 is in an off state so that it would not discharge the pull-down node PD. At this time, the potential of the pull-down node PD is pulled up so that the fourth transistor M4 and the eighth transistor M8 are turned on to avoid the noise of the pull-up node PU and the output terminal 8. Consequently, the coupling noise voltage generated by the first clock signal CLK is eliminated to ensure a low voltage output to maintain the output stability of the signal.

During the fifth period (labeled as ⑤ in FIGS. 12A and 12B), for the $n^{th}$ stage of shift register unit $SR_n$, the first clock signal CLK is at a low level, and the second clock signal CLKB is at a high level. At this moment, the seventh transistor M7 is turned off. The fifth transistor M5 is turned on by the high level of the second clock signal CLKB. The sixth transistor M6 is still in an off state so that the potential of the pull-down node PD is still pulled up and the fourth transistor M4 and the eighth transistor M8 are turned on to avoid the noise of the pull-up node PU and the output terminal 8.

In the subsequent period before the next frame of the scanned image enters, the fourth and fifth periods are repeated. When the next frame enters, the output G(n−1) of the previous stage is at a high level to return to the first period.

Although the respective embodiments as mentioned above show various combinations of the fifth transistor M5, the sixth transistor M6, the seventh transistor M7 and the eighth transistor M8, it should be understood for those skilled in the art that since their own functions are independent from each other, the transistors mentioned above can be implemented in any possible combination. That is to say, those skilled in the art may constitute a shift register unit by the above four transistors in any possible combinations and such combinations fall into the scope of the present disclosure.

The shift register unit and the gate driver provided by the present disclosure have been illustrated in detail. In addition, the present disclosure further provides a display device including the gate driver mentioned above. In particular, the display device may be a Liquid Crystal Display device, such a LCD panel, a LCD TV, mobile phone, electronic read, LCD display and the like.

The object, technical solution and effects of the present disclosure are further illustrated in detail by the particular embodiments mentioned above. It is appreciated that the above description is only particular embodiment of the disclosure, and is not used to limit the present disclosure. Any of modification, replacement and improvement without departing from the spirit and principle of the present disclosure fall to the scope of the present disclosure.

What is claimed is:

1. A shift register unit, comprising:
pre-charging and scanning module configured to charge a pull-up node to pull up its potential or to maintain the pull-up level according to a shift trigger signal, a first clock signal and a second clock signal;
a reset module configured to control the pull-up node and an output terminal to discharge to be reset to a low level according to a reset signal and the second clock signal; and
a switching module configured to generate a shift direction control signal, and to exchange the shift trigger signal and the reset signal and to exchange the first and second clock signals while a forward scanning and a reverse scanning are switched,
further comprising a shift trigger signal/reset signal input terminal, a reset signal/shift trigger signal input terminal, a positive/negative power supply voltage input terminal, a negative/positive power supply voltage input terminal and an output terminal, a first clock terminal configured to couple a first clock signal, and a second clock terminal configured to couple a second clock signal, the time sequence of which is different from that of the first clock signal, wherein
the pre-charging and scanning module comprising:
a first transistor, a gate of which is connected to the shift trigger signal/reset signal input terminal, and a source of which is connected to the positive/negative power supply voltage input terminal;
a second transistor, a gate of which is connected to the reset signal/shift trigger signal input terminal, a source of which is connected to a drain of the first transistor, and a drain of which is connected to the negative/positive power supply voltage input terminal;
a third transistor, a gate of which is connected to the drain of the first transistor, a source of which is connected to the first clock signal, and a drain of which is connected to the output terminal; and
a capacitor connected between the drain of the first transistor and the output terminal;
the reset module comprising:
the second transistor; and
a fourth transistor, a gate of which is connected to the second clock terminal, a source of which is connected to the output terminal, and a drain of which is connected to a constantly low level terminal;
wherein, under the control of the switching module,
when the shift register unit shifts in a forward direction, the shift trigger signal/reset signal input terminal is coupled to a shift trigger signal, the reset signal/shift trigger signal input terminal is coupled to a reset signal, the positive/negative power supply voltage input terminal is coupled to a high level signal, and the negative/positive power supply voltage input terminal is coupled to a low level signal; and
when the shift register unit shifts in a reverse direction, the shift trigger signal/reset signal input terminal is coupled to the reset signal, the reset signal/shift trigger signal input terminal is coupled to the shift trigger signal, the positive/negative power supply voltage input terminal is coupled to the low level signal, and the negative/positive power supply voltage input terminal is coupled to the high level signal.

2. The shift register unit according to claim 1, further comprising a fifth transistor, a source and gate of which are coupled to each other, the source of which is coupled to the second clock terminal, and a drain of which is coupled to the gate of the fourth transistor.

3. The shift register unit according to claim 2, further comprising a seventh transistor, a source and gate of which are coupled to each other, the source of which is coupled to the first clock terminal, and a drain of which is coupled to the gate of the fourth transistor.

4. The shift register unit according to claim 1, further comprising a sixth transistor, a source of which is coupled to the gate of the fourth transistor, and a drain of which is coupled to the constantly low level terminal.

5. The shift register unit according to claim 4, further comprising a seventh transistor, a source and gate of which are coupled to each other, the source of which is coupled to the first clock terminal, and a drain of which is coupled to the gate of the fourth transistor.

6. The shift register unit according to claim 1, further comprising an eighth transistor, a gate of which is coupled to the gate of the fourth transistor, a source of which is coupled to the source of the second transistor, and a drain of which is coupled to the constantly low level terminal.

7. The shift register unit according to claim 6, further comprising a seventh transistor, a source and gate of which are coupled to each other, the source of which is coupled to the first clock terminal, and a drain of which is coupled to the gate of the fourth transistor.

8. The shift register unit according to claim 1, further comprising a seventh transistor, a source and gate of which are coupled to each other, the source of which is coupled to the first clock terminal, and a drain of which is coupled to the gate of the fourth transistor.

9. A gate driver circuit, which is cascade connected by N shift register units according to claim 1, N being a natural number larger than 1, wherein
except a first stage of shift register unit, the output signal of a previous stage of shift register unit functions as the shift trigger signal of each of the shift register unit, and a Start signal (STV) functions as the shift trigger signal of the first shift register unit;

except a last stage of the shift register unit, the output signal of a subsequent stage of shift register units functions as the reset signal of each of the shift register unit, and the Start signal (STV) functions as the reset signal/of the last shift register unit, such that when the shift register unit switches between the forward shift and the reverse shift, the first and second clock signals are exchanged with each other, the shift trigger signal and the reset signal are exchanged, and the high and low level signals coupled to the positive/negative power supply voltage input terminals are exchanged, wherein the shift register unit further comprising a shift trigger signal/reset signal input terminal, a reset signal/shift trigger signal input terminal, a positive/negative power supply voltage input terminal, a negative/positive power supply voltage input terminal and an output terminal, a first clock terminal configured to couple a first clock signal, and a second clock terminal configured to couple a second clock signal, a time sequence of which is different from that of the first clock signal, wherein the pre-charging and scanning module comprising:

a first transistor, a gate of which is connected to the shift trigger signal/reset signal input terminal, and a source of which is connected to the positive/negative power supply voltage input terminal;

a second transistor, a gate of which is connected to the reset signal/shift trigger signal input terminal, a source of which is connected to a drain of the first transistor, and a drain of which is connected to the negative/positive power supply voltage input terminal;

a third transistor, a gate of which is connected to the drain of the first transistor, a source of which is connected to the first clock signal, and a drain of which is connected to the output terminal; and a capacitor connected between the drain of the first transistor and the output terminal;

the reset module comprising:

the second transistor; and a fourth transistor, gate of which is connected to the second clock terminal, the source of which is connected to the output terminal, and the drain of which is connected to a constantly low level terminal;

wherein, under the control of the switching module, when the shift register unit shifts in a forward direction, the shift trigger signal/reset signal input terminal is coupled to a shift trigger signal, the reset signal/shift trigger signal input terminal is coupled to a reset signal, the positive/negative power supply voltage input terminal is coupled to a high level signal, and the negative/positive power supply voltage input terminal is coupled to a low level signal; and when the shift register unit shifts in a reverse direction, the shift trigger signal/reset signal input terminal is coupled to the reset signal, the reset signal/shift trigger signal input terminal is coupled to the shift trigger signal, the positive/negative power supply voltage input terminal is coupled to the low level signal, and the negative/positive power supply voltage input terminal is coupled to the high level signal.

10. The gate driver circuit according to claim 9, further comprising a fifth transistor, a source and gate of which are coupled to each other, the source of which is coupled to the second clock terminal, and a drain of which is coupled to the gate of the fourth transistor.

11. The gate driver circuit according to claim 10, further comprising a seventh transistor, a source and gate of which are coupled to each other, the source of which is coupled to the first clock terminal, and a drain of which is coupled to the gate of the fourth transistor.

12. The gate driver circuit according to claim 9, further comprising a sixth transistor, a source of which is coupled to the gate of the fourth transistor, and a drain of which is coupled to the constantly low level terminal.

13. The gate driver circuit according to claim 12, further comprising a seventh transistor, a source and gate of which are coupled to each other, the source of which is coupled to the first clock terminal, and a drain of which is coupled to the gate of the fourth transistor.

14. The gate driver circuit according to claim 9, further comprising an eighth transistor, a gate of which is coupled to the gate of the fourth transistor, a source of which is coupled to the source of the second transistor, and a drain of which is coupled to the constantly low level terminal.

15. The gate driver circuit according to claim 14, further comprising a seventh transistor, a source and gate of which are coupled to each other, the source of which is coupled to the first clock terminal, and a drain of which is coupled to the gate of the fourth transistor.

16. The gate driver circuit according to claim 9, further comprising a seventh transistor, a source and gate of which are coupled to each other, the source of which is coupled to the first clock terminal, and a drain of which is coupled to the gate of the fourth transistor.

17. A display device, comprising the gate driver circuit according to claim 9.

* * * * *